US012062537B2

(12) United States Patent
Xue et al.

(10) Patent No.: US 12,062,537 B2
(45) Date of Patent: Aug. 13, 2024

(54) HIGH ETCH SELECTIVITY, LOW STRESS ASHABLE CARBON HARD MASK

(71) Applicant: LAM RESEARCH CORPORATION, Fremont, CA (US)

(72) Inventors: Jun Xue, Fremont, CA (US); Mary Anne Manumpil, Northridge, CA (US); Shih-Ked Lee, Fremont, CA (US); Samantha SiamHwa Tan, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 401 days.

(21) Appl. No.: 17/439,948

(22) PCT Filed: Mar. 18, 2020

(86) PCT No.: PCT/US2020/023239
§ 371 (c)(1),
(2) Date: Sep. 16, 2021

(87) PCT Pub. No.: WO2020/197866
PCT Pub. Date: Oct. 1, 2020

(65) Prior Publication Data
US 2022/0181147 A1 Jun. 9, 2022

Related U.S. Application Data

(60) Provisional application No. 62/823,211, filed on Mar. 25, 2019.

(51) Int. Cl.
*H01L 21/02* (2006.01)
*C23C 16/26* (2006.01)
(Continued)

(52) U.S. Cl.
CPC ........ *H01L 21/02274* (2013.01); *C23C 16/26* (2013.01); *C23C 16/45536* (2013.01);
(Continued)

(58) Field of Classification Search
None
See application file for complete search history.

(56) References Cited

U.S. PATENT DOCUMENTS 6,159,558 A   12/2000  Wolfe et al.
6,573,030 B1   6/2003  Fairbairn et al.
(Continued)

FOREIGN PATENT DOCUMENTS

CN    104513973 A   4/2015
JP    H1012608 A    1/1998
(Continued)

OTHER PUBLICATIONS

Chinese Office Action for corresponding Chinese Application No. 202080024547.9 issued Mar. 1, 2023.
(Continued)

*Primary Examiner* — Asok K Sarkar

(57) ABSTRACT

A method for depositing a carbon ashable hard mask layer on a substrate includes a) arranging a substrate in a processing chamber; b) setting chamber pressure in a predetermined pressure range; c) setting a substrate temperature in a predetermined temperature range from −20° C. to 200° C.; d) supplying a gas mixture including hydrocarbon precursor and one or more other gases; and e) striking plasma by supplying RF plasma power for a first predetermined period to deposit a carbon ashable hard mask layer on the substrate.

34 Claims, 5 Drawing Sheets

(51) Int. Cl.
*C23C 16/455* (2006.01)
*C23C 16/505* (2006.01)
*H01L 21/308* (2006.01)
*H01L 21/311* (2006.01)
*H01L 21/3213* (2006.01)

(52) U.S. Cl.
CPC ...... *C23C 16/505* (2013.01); *H01L 21/02115* (2013.01); *H01L 21/0228* (2013.01); *H01L 21/3081* (2013.01); *H01L 21/3086* (2013.01); *H01L 21/31144* (2013.01); *H01L 21/32139* (2013.01)

(56) References Cited

U.S. PATENT DOCUMENTS

| | | | |
|---|---|---|---|
| 6,750,127 B1 * | 6/2004 | Chang | H01L 21/32139 438/585 |
| 6,939,808 B2 | 9/2005 | Tzou et al. | |
| 6,989,332 B1 | 1/2006 | Bell et al. | |
| 2007/0032054 A1 * | 2/2007 | Ramaswamy | C23C 16/26 438/513 |
| 2009/0255558 A1 | 10/2009 | Inukai et al. | |
| 2011/0256726 A1 | 10/2011 | LaVoie et al. | |
| 2012/0276743 A1 | 11/2012 | Won et al. | |
| 2013/0260057 A1 | 10/2013 | Wu et al. | |
| 2014/0113457 A1 | 4/2014 | Sims et al. | |
| 2015/0093908 A1 | 4/2015 | Reddy et al. | |
| 2018/0354804 A1 | 12/2018 | Venkatasubramanian et al. | |

FOREIGN PATENT DOCUMENTS

| | | |
|---|---|---|
| JP | 2015070270 A | 4/2015 |
| JP | 2017504209 A | 2/2017 |
| TW | 201144475 A | 12/2011 |
| WO | WO-2011146212 A2 | 11/2011 |

OTHER PUBLICATIONS

International Search Report and Written Opinion of the ISA issued in PCT/US2020/023239, mailed Jul. 17, 2020; ISA/KR.
Office Action and Search Report for Chinese Application No. 202080024547.9 dated Mar. 2023.
Taiwanese Office Action and Search Report for Application No. 109109539 dated Dec. 13, 2023.
Japanese Office Action for Japanese Application No. 2021-557313 mailed Apr. 2, 2024.

* cited by examiner

US 12,062,537 B2

HIGH ETCH SELECTIVITY, LOW STRESS ASHABLE CARBON HARD MASK

CROSS-REFERENCE TO RELATED APPLICATIONS

The present disclosure is a U.S. National Phase Application under 35 U.S.C. 371 of International Application No. PCT/US2020/023239, filed on Mar. 18, 2020, which claims the benefit of U.S. Patent Application No. 62/823,211 filed on Mar. 25, 2019. The entire disclosures of the applications referenced above are incorporated herein by reference.

FIELD

The present disclosure relates generally to substrate processing systems and more particularly to systems and methods for depositing ashable carbon hard masks.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems perform treatments on substrates such as semiconductor wafers. Examples of substrate treatments include deposition, ashing, etching, cleaning and/or other processes. Etching usually includes either wet chemical etching or dry etching. Dry etching may be performed using plasma generated by inductively-coupled plasma (ICP) or capacitively coupled plasma (CCP).

ICP systems generate plasma by supplying RF plasma power to coils arranged outside of a processing chamber adjacent to a dielectric window. Process gas mixtures flowing inside the processing chamber are ignited by magnetic fields to create plasma.

CCP systems generate plasma using electrodes arranged in the processing chamber. For example, one electrode may be arranged in a substrate support below the substrate and another electrode such as a showerhead is arranged above the substrate. RF plasma power is supplied across the electrodes to ignite gas located between the electrodes.

SUMMARY

A method for depositing a carbon ashable hard mask layer on a substrate includes a) arranging a substrate in a processing chamber; b) setting chamber pressure in a predetermined pressure range; c) setting a substrate temperature in a predetermined temperature range from −20° C. to 200° C.; d) supplying a gas mixture including hydrocarbon precursor and one or more other gases; and e) striking plasma by supplying RF plasma power for a first predetermined period to deposit a carbon ashable hard mask layer on the substrate.

In other features, the processing chamber is an inductively coupled plasma chamber. The RF plasma power in e) is delivered at a first power level in a range from 30 W to 3000 W. The method includes supplying RF bias power during the first predetermined period at a second power level in a range from greater than 0 W to 1000 W.

In other features, the method includes f) after the first predetermined period, stopping flow of the hydrocarbon precursor; and g) performing a substrate treatment on the substrate to reduce stress. The method includes performing the deposition of the carbon ashable hard mask and the substrate treatment one or more additional times.

In other features, the deposition of the carbon ashable hard mask comprises 30% to 95% of a deposition/treatment period and the substrate treatment comprises 70% to 5% of the deposition/treatment period. The deposition of the carbon ashable hard mask and the substrate treatment are repeated at a frequency in a range from 0.05 Hz to 1000 Hz.

In other features, g) includes: g1) supplying an inert gas mixture; g2) supplying the RF plasma power at a third power level that is less than the first power level; and g3) supplying the RF bias power at a fourth power level that is less than the second power level.

In other features, g) further includes g4) after a second predetermined period at the fourth power level, supplying the RF bias power at a fifth power level that is greater than the fourth power level for a third predetermined period; and g5) after the third predetermined period, supplying the RF bias power at a sixth power level that is less than the fourth power level for a fourth predetermined period.

In other features, the method includes repeating c) to g5) one or more times. The third power level is in a range from 0 W to 500 W. The fourth power level is in a range from 30 W to 1000 W. The fifth power level is in range from 100 W to 1500 W. The sixth power level is in range from 30 W to 1000 W.

In other features, the predetermined temperature range is from 0° C. to 80° C. The predetermined pressure range is from 5 mT to 450 mT. The predetermined pressure range is from 5 mT to 35 mT. The processing chamber is a capacitively-coupled plasma chamber.

A method for depositing a carbon ashable hard mask layer on a substrate includes a) arranging a substrate in a processing chamber; b) setting chamber pressure in a predetermined pressure range; c) setting a substrate temperature in a predetermined temperature range; d) supplying a gas mixture including hydrocarbon precursor and one or more gases; e) striking plasma by supplying RF plasma power for a first predetermined period to deposit a carbon ashable hard mask layer; f) after the first predetermined period, stopping flow of the hydrocarbon precursor; and g) performing a substrate treatment on the substrate to reduce stress.

In other features, the method includes performing the deposition of the carbon ashable hard mask and the substrate treatment one or more additional times. The deposition of the carbon ashable hard mask is performed for 30% to 95% of a deposition/treatment period and the substrate treatment is performed for 70% to 5% of the deposition/treatment period. The deposition of the carbon ashable hard mask and the substrate treatment are repeated at a frequency in a range from 0.05 Hz to 1000 Hz.

In other features, g) includes: g1) supplying an inert gas mixture; g2) supplying the RF plasma power at a third power level that is less than the first power level; and g3) supplying the RF bias power at a fourth power level that is less than the second power level.

In other features, g) includes: g4) after a second predetermined period at the fourth power level, supplying the RF bias power at a fifth power level that is greater than the fourth power level for a third predetermined period; and g5) after the third predetermined period, supplying the RF bias power at a sixth power level that is less than the fourth power level for a fourth predetermined period. The RF plasma power in e) is delivered at a first power level in a range from 30 W to 3000 W and further comprising supplying RF bias power during the first predetermined period at a second power level in a range from greater than 0 W to 1000 W.

In other features, the method includes repeating c) to g5) one or more times. The third power level is in a range from 0 W to 500 W. The fourth power level is in a range from 30 W to 1000 W, the fifth power level is in range from 100 W to 1500 W, and the sixth power level is in range from 30 W to 1000 W.

In other features, the predetermined temperature range is from 0° C. to 80° C. The predetermined pressure range is from 5 mT to 450 mT. The predetermined pressure range is from 5 mT to 35 mT. The processing chamber is a capacitively-coupled plasma chamber.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Substrates such as semiconductor memory are increasing requiring higher numbers of pairs of memory cells to improve memory capacity. To increase the memory pairs, high aspect ratio (HAR) etching is performed. Hard masks are used during etching to prevent etching of some exposed materials while etching other exposed materials. High selectivity and low stress ashable hard masks (AHMs) are needed to enable HAR etching.

Candidate AHM films include high selectivity transparent (HST) film, diamond-like carbon (DLC) film, and ashable carbon extension (ACE) film. However, each of these films has drawbacks. These films have low density, high hydrogen (H) content and/or high stress. Low density and high H decrease etch resistivity. High stress induces film delamination.

A carbon-based AHM film according to the present disclosure has relatively high etch resistivity with low stress. The carbon-based AHM film is deposited using a hydrocarbon precursor and one or more other gases at relatively low temperatures. Deposition performed at low temperatures preserves $sp^3$ bonds. Plasma treatment can be performed after deposition to reduce stress and minimize H composition.

For example, the hydrocarbon precursor comprises $C_xH_y$, wherein x is an integer from 1 to 10 and y is an integer from 2 to 24. For example, the hydrocarbon precursor can include methane ($CH_4$), acetylene ($C_2H_2$) or other hydrocarbon gas. The one or more other gases are selected from a group consisting of helium (He), argon (Ar), krypton (Kr), neon (Ne), molecular nitrogen ($N_2$), and molecular hydrogen ($H_2$).

In some examples, deposition and treatment are performed until a desired film thickness is reached. In some examples, either cyclic deposition or pulsing deposition is performed. If the deposition rate is low, a cyclic deposition mode is used. If the deposition rate is higher, then a pulsing deposition mode is used. In some examples, the treatment includes the use of an inert plasma gas mixture to treat the deposited film to thereby reduce film stress and minimize H composition. In some examples, the inert plasma gas mixture includes one or more gases selected from a group consisting of helium (He), argon (Ar), krypton (Kr), and neon (Ne).

Figure 1:
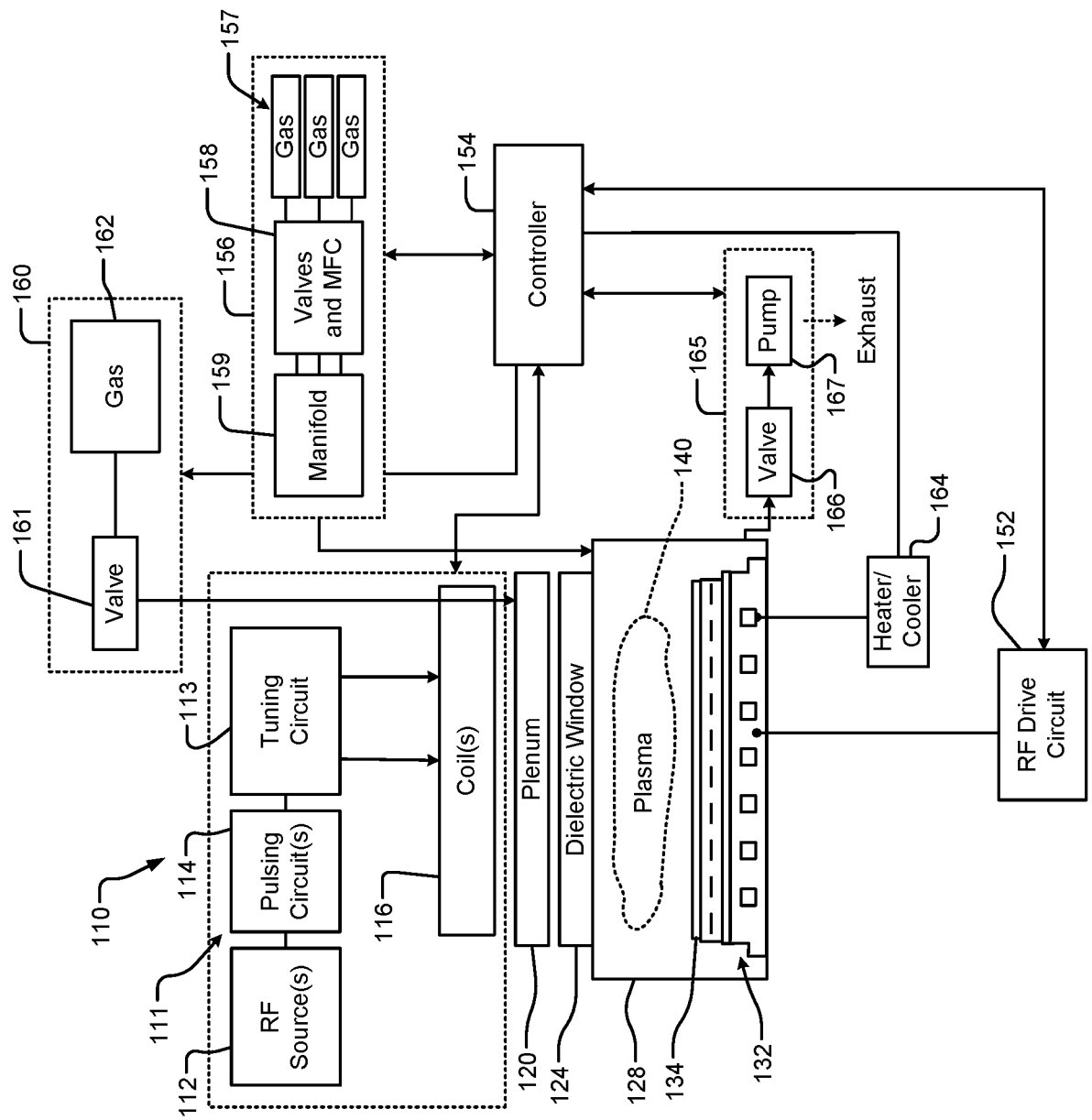
FIG. 1 is a functional block diagram of an example of an inductively coupled plasma (ICP) substrate processing system for depositing an ashable hard mask according to the present disclosure.

Referring now to FIG. 1, an example of a substrate processing system 110 according to the present disclosure is shown. The substrate processing system 110 includes a coil driving circuit 111. In some examples, the coil driving circuit 111 includes an RF source 112, a pulsing circuit 114, and a tuning circuit 113. The pulsing circuit 114 controls a TCP envelope of the RF signal and varies a duty cycle of TCP envelope between 1% and 99% during operation. As can be appreciated, the pulsing circuit 114 and the RF source 112 can be combined or separate.

The tuning circuit 113 may be directly connected to one or more inductive coils 116. The tuning circuit 113 tunes an output of the RF source 112 to a desired frequency and/or a desired phase, matches an impedance of the coils 116 and/or splits power between the coils 116. While examples including multiple coils are shown, a single coil including a single conductor or multiple conductors can be used.

A dielectric window 124 is arranged along one side of a processing chamber 128. The processing chamber 128 further comprises a substrate support (or pedestal) 132 to support a substrate 134. The substrate support 132 may include an electrostatic chuck (ESC), a mechanical chuck or other type of chuck. Process gas is supplied to the processing chamber 128 and plasma 140 is generated inside of the processing chamber 128. An RF bias drive circuit 152 may be used to supply an RF bias to the substrate support 132 during operation to control ion energy. The RF bias drive circuit 152 may include an RF source and an impedance matching circuit (not shown).

A gas delivery system 156 may be used to supply a process gas mixture to the processing chamber 128. The gas delivery system 156 may include gas sources 157 (e.g. precursor, vapor, one or more other gases, inert gases), a gas metering system 158 such as valves and mass flow controllers, and a manifold 159. A gas injector (not shown) may be arranged at a center of the dielectric window 124 (or other location) and is used to inject gas mixtures from the gas delivery system 156 into the processing chamber 128.

A heater/cooler 164 may be used to heat/cool the substrate support 132 to a predetermined temperature. An exhaust system 165 includes a valve 166 and pump 167 to control pressure in the processing chamber and/or to remove reactants from the processing chamber 128 by purging or evacuation.

A controller 154 may be used to control the process. The controller 154 monitors system parameters and controls delivery of the gas mixtures, striking, maintaining and extinguishing the plasma, removal of reactants, supply of cooling gas, and so on.

Figure 2:
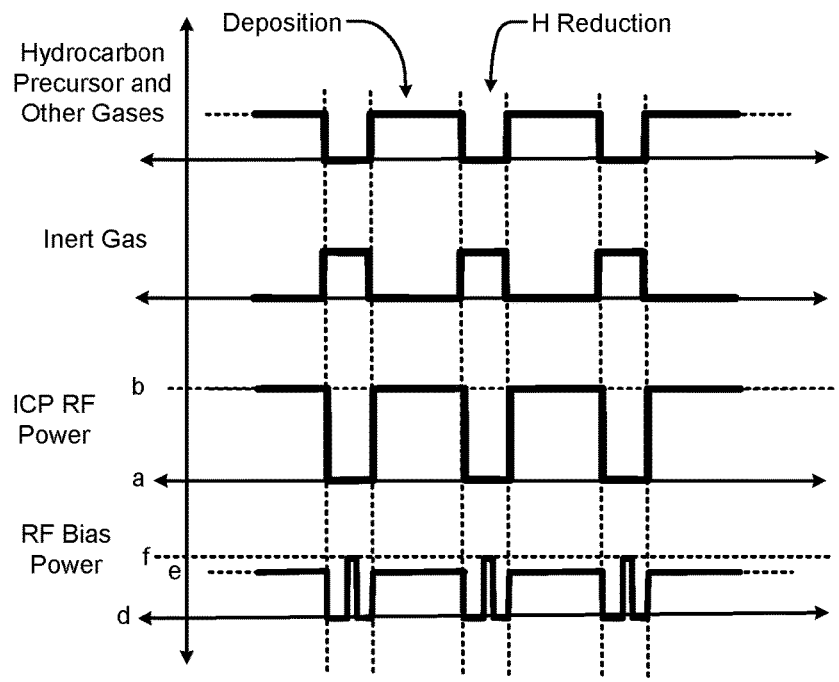
FIG. 2 is a graph illustrating an example of timing of RF plasma power, RF bias power, and gas flows according to the present disclosure.

Referring now to FIG. 2, examples of timing diagrams for delivery of a gas mixture (including hydrocarbon precursor and one or more other gases), an inert gas mixture, RF plasma power and RF bias power are shown. The carbon ashable hard mask is deposited by supplying the gas mixture and by supplying RF plasma power and/or RF bias power. In some examples, some or all of the deposition steps are followed by plasma treatment using the inert plasma gas mixture (without precursor). In some examples, reactants are purged or evacuated from the chamber after deposition and before treatment. In other examples, flow of precursor is stopped prior to the treatment step without purging or evacuation.

In some examples, the deposition and treatment steps are performed at a frequency in a range from 0.05 Hz to 1000 Hz. In some examples, the deposition and treatment steps are performed at a frequency in a range from 0.1 Hz to 200 Hz. Deposition may comprise 30% to 95% of each period or cycle and treatment may comprise 70% to 5% of each period or cycle. In one example, deposition is performed for 10 seconds (s) of a 12 s period and treatment is performed for 2 s of the 12 s period or cycle, although other length periods or cycles may be used.

During the deposition step of the period or cycle, the gas mixture including hydrocarbon precursor gas and one or more other gases are supplied to the processing chamber. The RF plasma power is delivered at a first power level and the RF bias power is delivered at a second power level. In some examples, the first power level is in range from 30 W to 3000 W and the second power level is in a range from 0 W to 1000 W.

During the treatment step of the period or cycle, delivery of the hydrocarbon precursor is stopped and delivery of the inert gas mixture starts or continues (if the inert gas mixture was used in the preceding deposition step). If continued, a flow rate of the inert gas mixture can be increased, decreased or continued without change. Plasma may be maintained or extinguished. During treatment, the RF plasma power is delivered at a third power level that is less than the first power level. In some examples, the third power level is in a range from 0 W to 500 W.

The RF bias power may be varied during deposition and treatment. For example, the RF bias is initially delivered at a fourth power level, increased to a fifth power level above the second power level and then returned to a sixth power level (which is less than the second power level and may be the same as or different than the fourth power level). In some examples, the RF bias power is decreased, then pulsed above the RF bias power during deposition and then returned below the RF bias power during deposition. In some examples, the fourth power level is in a range from 30 W to 1000 W, the fifth power level is in range from 100 W to 1500 W, and the sixth power level is in range from 30 W to 1000 W. While examples of specific RF bias profiles are shown for illustration, other RF bias profiles can be used.

In some examples, deposition and treatment are performed at a temperature in a range from −20° C. to 200° C. In other examples, deposition and treatment are performed at a temperature in a range from −20° C. to 100° C. In still other examples, deposition and treatment are performed at a temperature in a range from 0° C. to 80° C.

In some examples, deposition and treatment are performed at a pressure in a range from 5 mT to 450 mT. In other examples, deposition and treatment are performed at a pressure in a range from 5 mT to 150 mT. In still other examples, deposition and treatment are performed at a pressure in a range from 5 mT to 35 mT.

Figure 3:
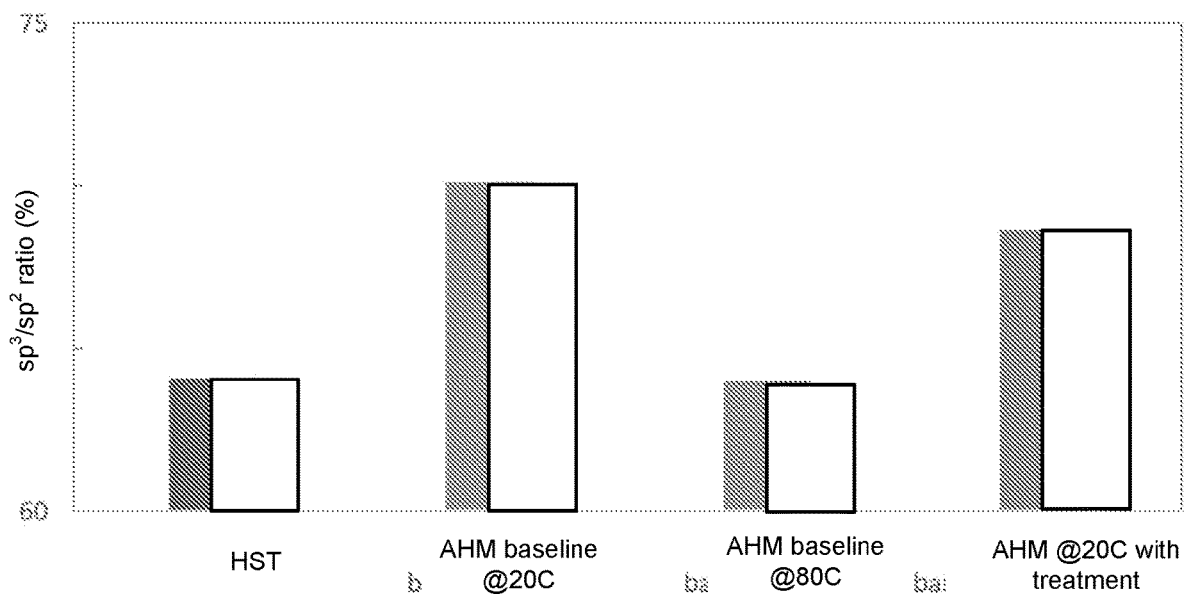
FIG. 3 is a graph illustrating an example of $sp^3/sp^2$ ratios of various films according to the present disclosure.

Referring now to FIG. 3, an $sp^3/sp^2$ ratio is shown for various different hard masks. Examples include HST, carbon AHM deposited at 20° C. (without treatment), carbon AHM deposited at 80° C. (without treatment) and carbon AHM deposited at 20° C. (with treatment). As will be described further below, the carbon AHM deposited at 20° C. (with treatment) is produced at low temperature with low film stress.

Figure 4:
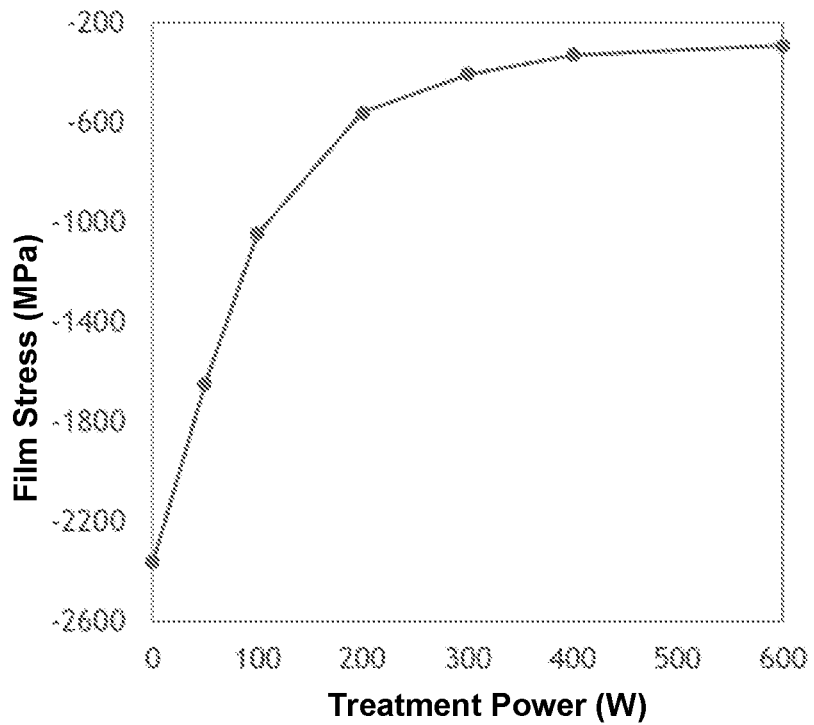
FIG. 4 is a graph illustrating an example of film stress as a function of treatment power.

Referring now to FIG. 4, tuning of the stress of the carbon AHM can be performed by adjusting power during the treatment portion of each period or cycle. As can be seen, film stress is reduced as power is increased. Stress of the carbon AHM is highest at about −2350 MPa with no treatment and stress decreases with treatment.

Figure 5:
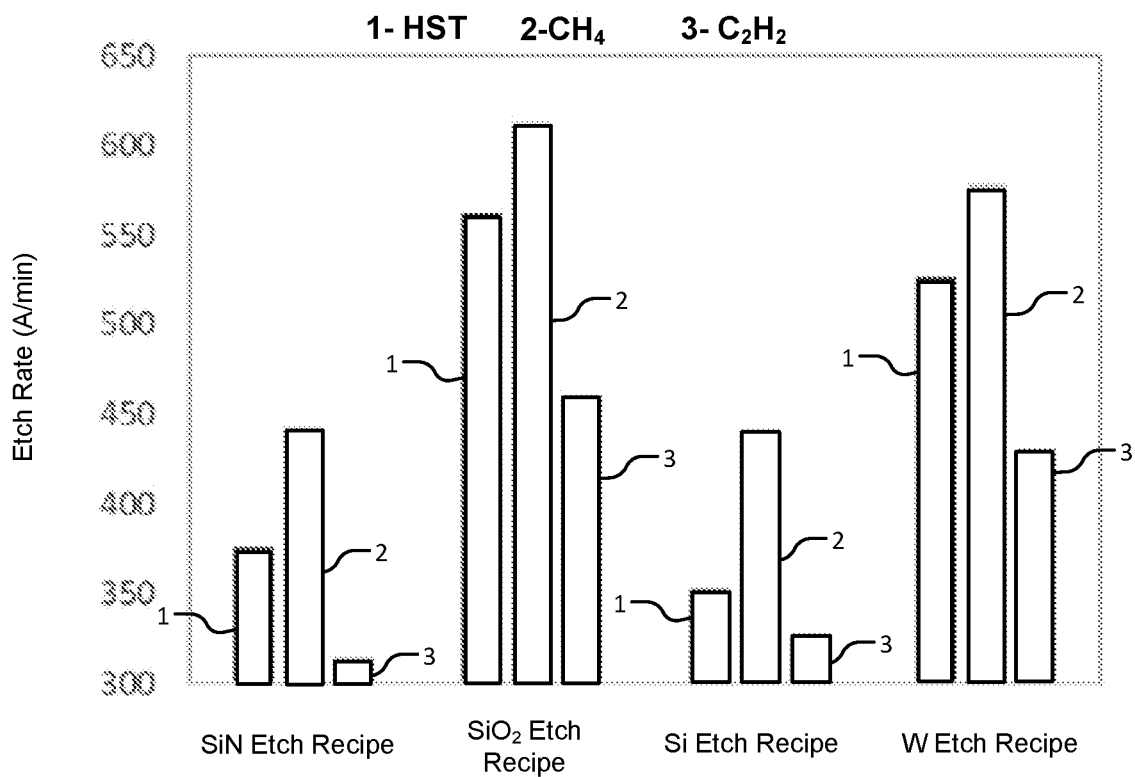
FIG. 5 is a graph illustrating an example of etch rates of various AHM films according to the present disclosure.

Referring now to FIG. 5, etch rates of various hard masks (HST, $CH_4$-based AHM with treatment, and $C_2H_2$-based AHM with treatment) are shown during etching of various types of film including silicon nitride ($Si_xN_y$), silicon dioxide ($SiO_2$), silicon (Si) and tungsten (W). In this example, the $C_2H_2$-based AHM has slightly lower etch rates as compared to HST. In this example, the $CH_4$-based AHM has slightly higher etch rates as compared to HST.

Figure 6:
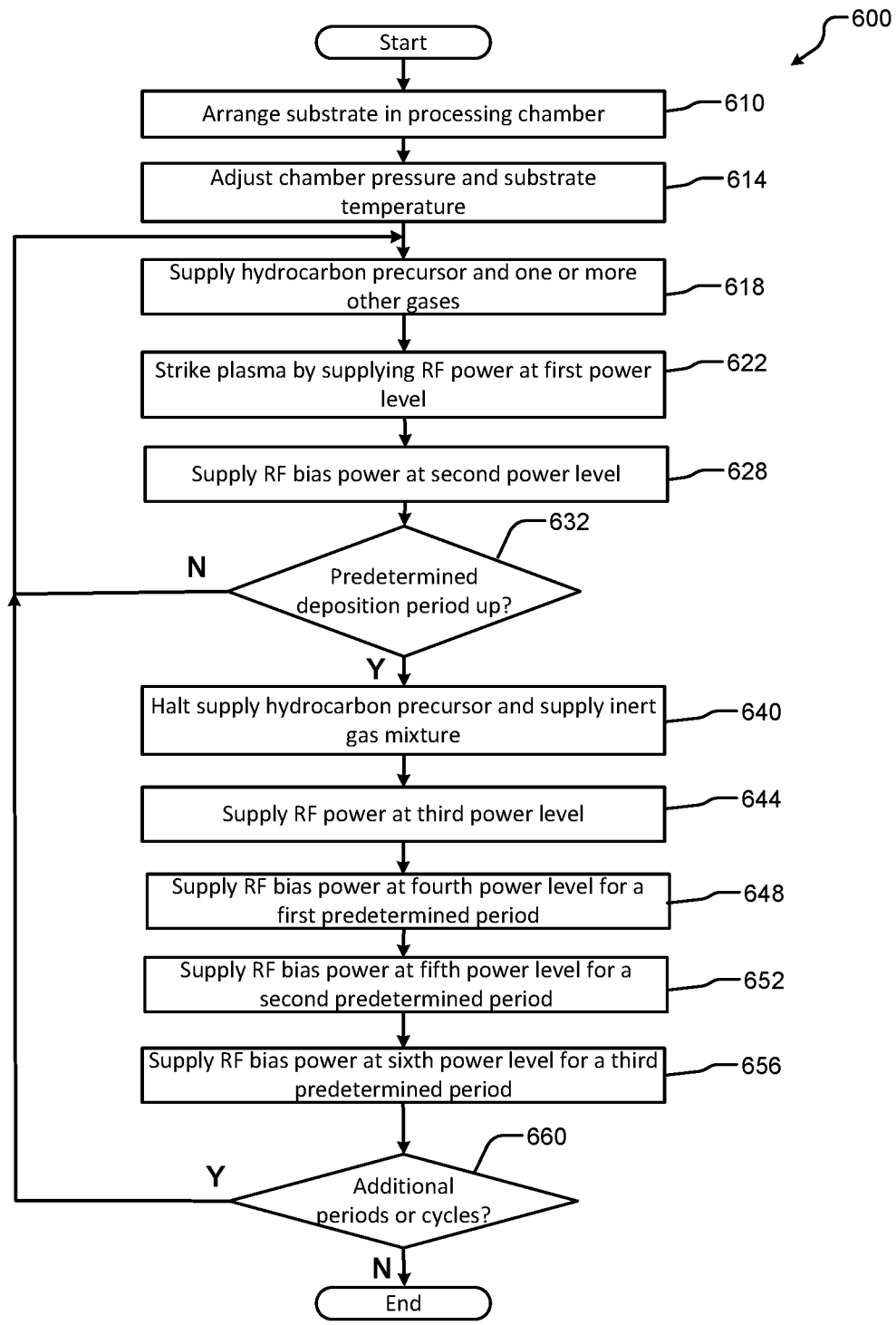
FIG. 6 is a flowchart of an example of a method for depositing a carbon AHM film according to the present disclosure.

Referring now to FIG. 6, a method 600 for depositing the carbon AHM is shown. At 610, a substrate is arranged in a processing chamber such as the processing chambers of FIG. 1. At 614, chamber pressure and substrate temperature are adjusted to predetermined pressure and temperature ranges. At 618, a gas mixture including a hydrocarbon precursor and one or more other gases are supplied to the processing chamber. At 622, plasma is struck in the processing chamber by supplying RF plasma power at a first power level. At 628, the RF bias power is supplied at a second power level.

At 632, the method determines whether a predetermined period is up. If 632 is false, the method returns to 618. Otherwise, the method continues at 640 and stops supplying the hydrocarbon precursor and starts or continues supplying the inert gas mixture.

At 644, the RF plasma power is supplied at a third power level. At 648, the RF bias power is supplied at a fourth power level. In some examples, the RF bias power continues at the fourth power level during the treatment period.

In other examples, the RF bias power is pulsed briefly during the treatment period. For example, the RF bias power continues at the fourth power level for a first predetermined period. At 652, the RF bias power is supplied at a fifth power level for a second predetermined period. At 656, the RF bias power is supplied at a sixth power level for a third predetermined. In some examples, the fifth power level is greater than the second power level, the fourth power level and the sixth power level. In some examples, the fourth power level and the sixth power level are the same.

At 660, the method determines whether additional periods or cycles need to be performed. If 660 is true, the method continues at 618. Otherwise, the method ends.

Figure 7:
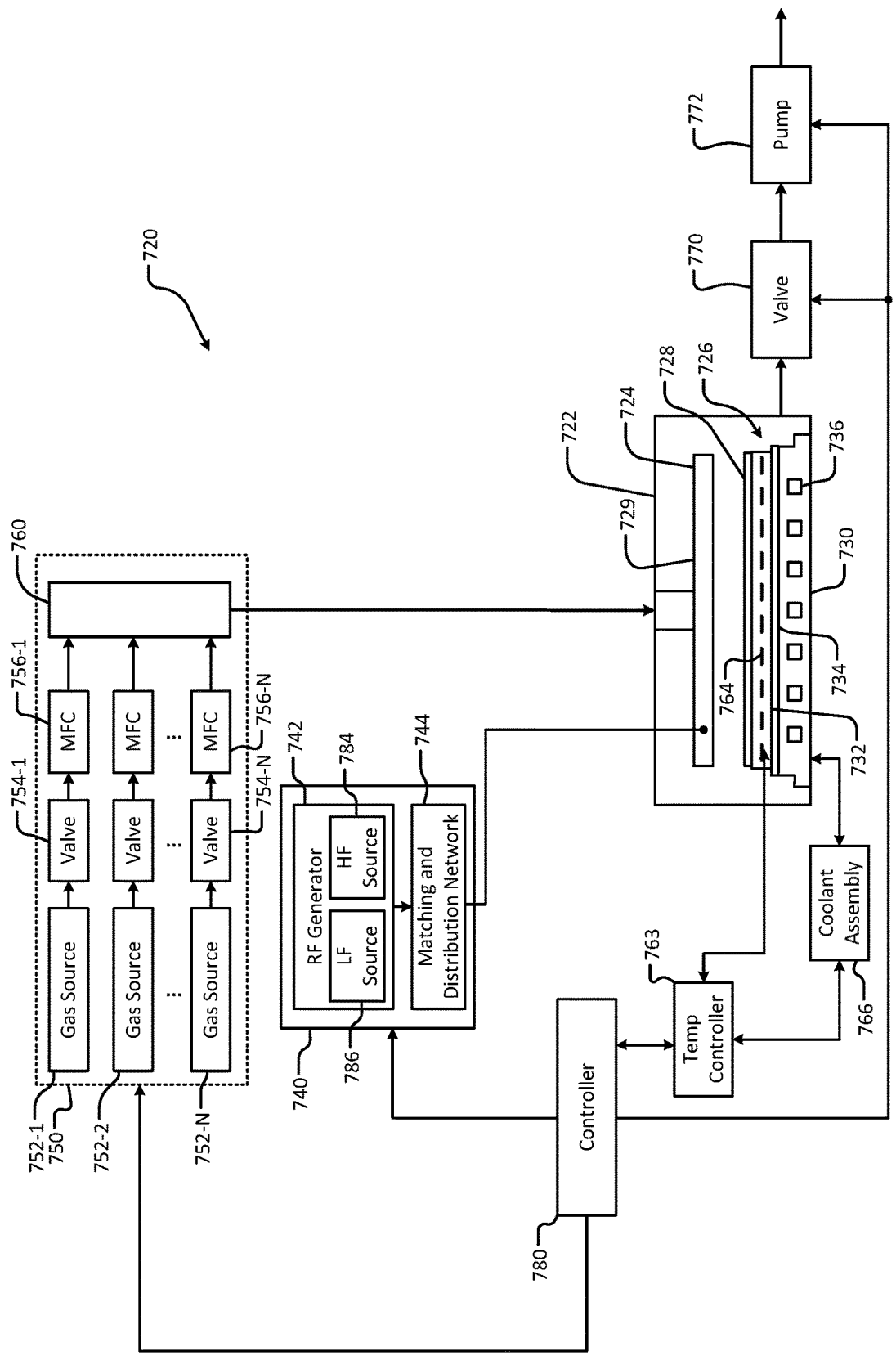
FIG. 7 is a functional block diagram of an example of a capacitively coupled plasma (CCP) substrate processing system for depositing an ashable hard mask according to the present disclosure.

Referring now to FIG. 7, another example of a substrate processing system 720 according to the present disclosure is shown. The substrate processing system 720 includes a processing chamber 722 that encloses other components of the substrate processing system 720 and contains the RF plasma (if used). The substrate processing system 720 includes an upper electrode 724 and a substrate support 726 such as an electrostatic chuck (ESC). During operation, a substrate 728 is arranged on the substrate support 726.

For example only, the upper electrode 724 may include a gas distribution device 729 such as a showerhead that introduces and distributes process gases. The gas distribution device 729 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which precursor, reactants, etch gases, inert gases, carrier gases, other process gases or purge gas flows. Alternately, the upper electrode 724 may include a conducting plate and the process gases may be introduced in another manner.

The substrate support 726 includes a baseplate 730 that acts as a lower electrode. The baseplate 730 supports a heating plate 732, which may correspond to a ceramic multi-zone heating plate. A thermal resistance layer 734 may be arranged between the heating plate 732 and the baseplate 730. The baseplate 730 may include one or more channels 736 for flowing coolant through the baseplate 730.

An RF generating system 740 generates and outputs an RF voltage to one of the upper electrode 724 and the lower electrode (e.g., the baseplate 730 of the ESC 726). The other one of the upper electrode 724 and the baseplate 730 may be DC grounded, AC grounded or floating. For example only, the RF generating system 740 may include an RF generator 742 that generates RF plasma power that is fed by a matching and distribution network 744 to the upper electrode 724 or the baseplate 730. In other examples, the plasma may be generated inductively or remotely.

A gas delivery system 750 includes one or more gas sources 752-1, 752-2, . . . , and 752-N (collectively gas sources 752), where N is an integer greater than zero. The gas sources 752 are connected by valves 754-1, 754-2, . . . , and 754-N (collectively valves 754) and MFCs 756-1, 756-2, . . . , and 756-N (collectively MFCs 756) to a manifold 760. Secondary valves may be used between the MFCs 756 and the manifold 760. While a single gas delivery system 750 is shown, two or more gas delivery systems can be used.

A temperature controller 763 may be connected to a plurality of thermal control elements (TCEs) 764 arranged in the heating plate 732. The temperature controller 763 may be used to control the plurality of TCEs 764 to control a temperature of the substrate support 726 and the substrate 728. The temperature controller 763 may communicate with a coolant assembly 766 to control coolant flow through the channels 736. For example, the coolant assembly 766 may include a coolant pump, a reservoir and/or one or more temperature sensors. The temperature controller 763 operates the coolant assembly 766 to selectively flow the coolant through the channels 736 to cool the substrate support 726. A valve 770 and pump 772 may be used to evacuate reactants from the processing chamber 722. A system controller 780 may be used to control components of the substrate processing system 720.

In some examples, the RF generator 742 includes a high frequency (HF) source 784 and a low frequency (LF) source 786. The HF source 784 operates in a frequency range from 13 MHz to 800 MHz. For example, the HF source 784 operates at 27 MHz or 60 MHz. In some examples, the HF source 784 outputs power in a range from 50 W to 3000 W. The LF source 786 operates in a frequency range from 200 kHz to 13 MHz. For example, the LF source 786 operates at 400 kHz, 2 MHz or 12.5 MHz. In some examples, the LF source 786 outputs power in a range from 100 W to 3000 W. As can be appreciated, deposition can be performed with RF power at HF and LF, HF or LF.

In some examples, RF power can be continuous or pulsed between one or more levels. If pulsed operation is used, pulsing can be performed at a frequency in a range from 1 Hz to 1 MHz. In some examples, chamber pressure is maintained at a predetermined pressure in a range from 5 mT to 450 mT. In other examples, deposition and treatment are performed at a pressure in a range from 5 mT to 150 mT. In still other examples, deposition and treatment are performed at a pressure in a range from 5 mT to 35 mT. As described above, plasma treatment using inert gas can be performed as described above to reduce film stress.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for depositing a carbon ashable hard mask layer on a substrate, comprising:
    a) arranging the substrate on a substrate support in a processing chamber;
    b) setting chamber pressure in a predetermined pressure range;
    c) setting a substrate temperature in a predetermined temperature range from −20° C. to 200° C.;
    d) supplying a gas mixture including hydrocarbon precursor and one or more other gases; and
    e) striking plasma by supplying RF plasma power to a coil arranged on a dielectric window above the substrate support for a first predetermined period to deposit a carbon ashable hard mask on the substrate, and further comprising supplying RF bias power to the substrate support during the first predetermined period.

2. The method of claim 1, wherein the processing chamber is an inductively coupled plasma chamber.

3. The method of claim 2, wherein the RF plasma power in e) is delivered at a first power level in a range from 30 W to 3000 W and further comprising supplying the RF bias power during the first predetermined period at a second power level in a range from greater than 0 W to 1000 W.

4. The method of claim 3, further comprising:
    f) after the first predetermined period, stopping flow of the hydrocarbon precursor; and
    g) performing a substrate treatment on the substrate to reduce stress.

5. The method of claim 4, further comprising performing the deposition of the carbon ashable hard mask and the substrate treatment one or more additional times.

6. The method of claim 4, wherein the deposition of the carbon ashable hard mask comprises 30% to 95% of a deposition/treatment period and the substrate treatment comprises 70% to 5% of the deposition/treatment period.

7. The method of claim 4, wherein the deposition of the carbon ashable hard mask and the substrate treatment are repeated at a frequency in a range from 0.05 Hz to 1000 Hz.

8. The method of claim 4, wherein g) includes:
    g1) supplying an inert gas mixture;
    g2) supplying the RF plasma power at a third power level that is less than the first power level; and
    g3) supplying the RF bias power at a fourth power level that is less than the second power level.

9. The method of claim 8, wherein g) further comprises:
    g4) after a second predetermined period at the fourth power level, supplying the RF bias power at a fifth power level that is greater than the fourth power level for a third predetermined period; and g5) after the third predetermined period, supplying the RF bias power at a sixth power level that is less than the fourth power level for a fourth predetermined period.

10. The method of claim 9, further comprising repeating c) to g5) one or more times.

11. The method of claim 10, wherein:
the third power level is in a range from 0 W to 500 W;
the fourth power level is in a range from 30 W to 1000 W;
the fifth power level is in range from 100 W to 1500 W; and
the sixth power level is in range from 30 W to 1000 W.

12. The method of claim 1, wherein the predetermined temperature range is from 0° ° C. to 80° C.

13. The method of claim 1, wherein the predetermined pressure range is from 5 mT to 450 mT.

14. The method of claim 1, wherein the predetermined pressure range is from 5 mT to 35 mT.

15. The method of claim 1 further comprising striking the plasma by supplying the RF plasma power for the first predetermined period to deposit the carbon ashable hard mask layer on the substrate using a cyclic deposition mode or a pulsing deposition mode, the cyclic deposition mode or the pulsing deposition mode being selected based on a deposition rate.

16. A method for depositing a carbon ashable hard mask layer on a substrate, comprising:
a) arranging the substrate in a processing chamber;
b) setting chamber pressure in a predetermined pressure range;
c) setting a substrate temperature in a predetermined temperature range;
d) supplying a gas mixture including hydrocarbon precursor and one or more gases;
e) striking plasma by supplying RF plasma power for a first predetermined period to deposit a carbon ashable hard mask using a cyclic deposition mode or a pulsing deposition mode, the cyclic deposition mode or the pulsing deposition mode being selected based on a deposition rate;
f) after the first predetermined period, stopping flow of the hydrocarbon precursor; and
g) performing a substrate treatment on the substrate to reduce stress.

17. The method of claim 16, further comprising performing the deposition of the carbon ashable hard mask and the substrate treatment one or more additional times.

18. The method of claim 17, wherein the deposition of the carbon ashable hard mask is performed for 30% to 95% of a deposition/treatment period and the substrate treatment is performed for 70% to 5% of the deposition/treatment period.

19. The method of claim 17, wherein the deposition of the carbon ashable hard mask and the substrate treatment are repeated at a frequency in a range from 0.05 Hz to 1000 Hz.

20. The method of claim 16, wherein the predetermined temperature range is from 0° ° C. to 80° C.

21. The method of claim 16, wherein the predetermined pressure range is from 5 mT to 450 mT.

22. The method of claim 16, wherein the predetermined pressure range is from 5 mT to 35 mT.

23. The method of claim 16, wherein the processing chamber is a capacitively-coupled plasma chamber.

24. The method of claim 16, wherein the RF plasma power in e) is delivered at a first power level in a range from 30 W to 3000 W and further comprising supplying RF bias power during the first predetermined period at a second power level in a range from greater than 0 W to 1000 W.

25. The method of claim 24, wherein g) includes:
g1) supplying an inert gas mixture;
g2) supplying the RF plasma power at a third power level that is less than the first power level; and
g3) supplying the RF bias power at a fourth power level that is less than the second power level.

26. The method of claim 25, wherein g) further comprises:
g4) after a second predetermined period at the fourth power level, supplying the RF bias power at a fifth power level that is greater than the fourth power level for a third predetermined period; and
g5) after the third predetermined period, supplying the RF bias power at a sixth power level that is less than the fourth power level for a fourth predetermined period.

27. The method of claim 26, wherein the RF plasma power in e) is delivered at a first power level in a range from 30 W to 3000 W and further comprising supplying RF bias power during the first predetermined period at a second power level in a range from greater than 0 W to 1000 W.

28. The method of claim 26, further comprising repeating c) to g5) one or more times.

29. The method of claim 26, wherein:
the third power level is in a range from 0 W to 500 W,
the fourth power level is in a range from 30 W to 1000 W,
the fifth power level is in range from 100 W to 1500 W, and
the sixth power level is in range from 30 W to 1000 W.

30. The method of claim 16 further comprising using the cyclic deposition mode when the deposition rate is less than a predetermined rate and using the pulsing deposition mode when the deposition rate is greater than the predetermined rate.

31. The method of claim 30 wherein the cyclic deposition mode comprises:
during a first time period, performing the deposition by (i) supplying the gas mixture and the RF plasma power and (ii) not supplying an RF bias power;
during a second time period, performing the substrate treatment by (i) stopping supply of the gas mixture, (ii) supplying an inert gas mixture, (iii) supplying the RF plasma power, and (iv) supplying the RF bias power; and
repeating performing the deposition and the substrate treatment.

32. The method of claim 30 wherein the pulsing deposition mode comprises supplying a pulsing RF bias power while continuously supplying the gas mixture, an inert gas, and the plasma.

33. The method of claim 32 wherein the deposition occurs between pulses of the pulsing RF bias power and the substrate treatment occurs during the pulses of the pulsing RF bias power.

34. The method of claim 16 further comprising:
arranging the substrate on a substrate support in the processing chamber; and
striking the plasma by supplying the RF plasma power to a coil arranged on a dielectric window above the substrate support for the first predetermined period to deposit the carbon ashable hard mask on the substrate; and
supplying RF bias power to the substrate support during the first predetermined period.

* * * * *